United States Patent
Webster et al.

(10) Patent No.: US 6,931,343 B2
(45) Date of Patent: Aug. 16, 2005

(54) ON-SIGNAL QUADRATURE MODULATOR CALIBRATION

(75) Inventors: Mark A. Webster, Indian Harbour Beach, FL (US); Michael J. Seals, Melbourne, FL (US); Bruce A. Cochran, Mesa, AZ (US)

(73) Assignee: Globespanvirata, Incorporated, Red Bank, NJ (US)

( * ) Notice: Subject to any disclaimer, the term of this patent is extended or adjusted under 35 U.S.C. 154(b) by 70 days.

(21) Appl. No.: 10/666,410

(22) Filed: Sep. 19, 2003

(65) Prior Publication Data

US 2005/0075815 A1 Apr. 7, 2005

(51) Int. Cl.[7] .............................................. G06F 19/00
(52) U.S. Cl. ........................ 702/107; 702/85; 702/106; 375/329
(58) Field of Search ............................ 702/85, 90, 104, 702/106, 107, 124, 126, 189; 375/260, 269, 329, 343

(56) References Cited

U.S. PATENT DOCUMENTS 5,721,754 A  *  2/1998  Chen .......................... 375/227
6,421,339 B1  *  7/2002  Thomas ...................... 370/352
6,778,613 B2  *  8/2004  Avidor et al. ............... 375/329

* cited by examiner

*Primary Examiner*—Bryan Bui
(74) *Attorney, Agent, or Firm*—Hunton & Williams, LLP

(57) ABSTRACT

An on-signal calibration system I and Q signals of a transmitter to remove distortions in the RF output signal. The transmitter generates I and Q values and converts, modulates and combines the I and Q values into the RF output signal for transmission. The calibration system includes a detector, a sampler, a selector, an imbalance estimator, and an IQ corrector. The detector senses the RF output signal and provides a detection signal indicative thereof. The sampler samples the detection signal and provides digital samples. The selector selects from among the digital samples that correspond to predetermined ranges of the I and Q values, or otherwise predetermined selection boxes at predetermined phases. The imbalance estimator determines at least one imbalance estimate based on selected digital samples. The IQ corrector corrects the I and Q values using at least one imbalance estimate.

32 Claims, 12 Drawing Sheets

ON-SIGNAL QUADRATURE MODULATOR CALIBRATION

BACKGROUND OF THE INVENTION

1. Field of the Invention

The present invention relates to calibration of a transmitter to remove distortions, and more particularly to on-signal quadrature modulator calibration using an output signal detector to remove DC, phase and amplitude imbalances.

2. Description of the Related Art

Many modern communications systems combine in-phase (I) and quadrature phase (Q) components in a transmitted signal. The I and Q components can be generated and combined in the digital domain without distortion. The combined digital signal must then be converted to an analog signal prior to up-conversion and transmission, which generates an undesired image that is difficult and expensive to eliminate. Alternatively, the I and Q components may be separately converted to analog signals, which are then combined in the analog domain. The analog processing components are not perfectly matched, so that several types of distortion are introduced into the signal path. These distortions include DC offsets and amplitude and phase imbalances. For example, after conversion to analog, an I DC offset is added to the I signal channel and a separate Q DC offset is added to the Q signal channel. One or more mixer stages are used to up convert each of the analog signals to a radio frequency (RF) level suitable for transmission. The local oscillator (LO) splitter carrier signals and the mixer stages are not perfectly matched resulting in amplitude and phase imbalances that cause distortions in the transmitted signal.

The distortions, caused by DC, amplitude and phase imbalances, degrade the performance of digital communication systems including systems employing digital signal processing (DSP) techniques. Amplitude and phase imbalances cause variations in constellation plots that degrade communication effectiveness. Large gain or phase imbalances can effectively disable reliable communications, particularly higher density modulation techniques used to achieve higher data transmission rates.

In many legacy systems, distortions have been measured and calibrated at the time of manufacture. Imbalances, however, can drift over time due to various factors including, for example, temperature and aging. Static compensation at the time of manufacture does not address the dynamic factors that affect radio operation during use. Several dynamic compensation techniques are known. Some methods use off-line signals, such as training signals or the like, which require taking the system off-line for calibration. Such off-line methods degrade overall system efficiency by consuming valuable time to perform calibration and compensation. Vital packets may be missed during the calibration process since the antenna(s) must be disconnected or otherwise disabled to prevent inadvertent transmissions. Some calibration techniques negatively impact the wireless medium, such as undesirable signal splattering. It is desired to provide an automatic and relatively simple imbalance compensation solution that operates on the actual communication signals (e.g., on-signal) without having to go off-line or perform separate calibration cycles.

SUMMARY OF THE INVENTION

An on-signal calibration system according to an embodiment of the present invention calibrates in-phase (I) and quadrature phase (Q) signals of a transmitter to remove distortions in the radio frequency (RF) output signal of the transmitter. The calibration process is performed during transmission and does not require separate calibration cycles. The transmitter generates I and Q values and converts, modulates and combines the I and Q values into the RF output signal for transmission. The calibration system includes a detector, a sampler, a selector, an imbalance estimator, and an IQ corrector. The detector senses the RF output signal and provides a detection signal indicative thereof. The sampler samples the detection signal and provides digital samples. The selector selects from among the digital samples that correspond to predetermined ranges of the I and Q values, or otherwise predetermined selection boxes at predetermined phases. The imbalance estimator determines at least one imbalance estimate based on selected digital samples. The IQ corrector corrects the I and Q values using at least one imbalance estimate.

In various configurations, the detector is an envelope detector, the sampler is an analog to digital converter (ADC) and the selector selects digital samples. The digital samples that are selected depend upon the particular imbalance targeted. For the I channel DC offset, the selected digital samples may correspond with first and second selection boxes symmetrically located on either side of an I/Q origin on the I-axis of a plot of the I and Q values. For the Q channel DC offset, the selected digital samples may correspond with third and fourth selection boxes symmetrically located on either side of the I/Q origin on the Q-axis. For the amplitude imbalance, a combination of the digital samples of the first and second selection boxes and a combination of the digital samples of the third and fourth selection boxes may be used. For the phase imbalance, the selector may select the digital samples that correspond with selection boxes symmetrically located on either side of an I/Q origin on a 45 degree axis of a plot of the I and Q values and selection boxes that are symmetrically located on either side of the I/Q origin on a 135 degree axis.

The calibration system may include a power circuit that determines digital power values, where the selector selects from among the digital power values. In one embodiment, the imbalance estimator determines at least one imbalance estimate based on a ratio of selected digital power values. Alternatively, the calibration system may include a magnitude circuit that determines digital magnitude values, where the selector selects from among the digital magnitude values. In this latter case, the imbalance estimator determines the at least one imbalance estimate based on a ratio of the selected magnitude values.

A transmitter according to an embodiment of the present invention includes a baseband processor providing I and Q signals, an RF quadrature modulator, and an output signal detector. The RF quadrature modulator coverts the I and Q signals into an RF output signal. The output signal detector senses a characteristic of the RF output signal indicative of the at least one imbalance and outputs a characteristic signal. The baseband processor includes an I/Q corrector, a hit detector, a selector, and an imbalance estimator. The I/Q corrector corrects the I and Q signals using at least one imbalance metric. The hit detector generates gate signals indicative of predetermined ranges of the I and Q signals. The selector selects portions of the characteristic signal based on the gate signals. The imbalance estimator uses selected portions of the characteristic signal to determine the at least one imbalance metric.

In various embodiments, the output signal detector is an envelope detector and the characteristic signal is an envelope signal. The baseband processor includes a core that generates I and Q digital values and a sampler that samples the envelope signal and that provides digital samples. In one embodiment, the hit detector provides the gate signals indicative of a plurality of symmetric selection boxes at predetermined phases of the I and Q digital values, and the selector selects from among the digital samples based on the gate signals.

A method of on-signal calibration of an RF quadrature modulator according to an embodiment of the present invention includes detecting the RF output signal and providing a detection signal, sampling the detection signal and providing digital samples, selecting from among the digital samples corresponding to predetermined ranges of the I and Q digital values, estimating at least one imbalance metric using selected digital samples, and calibrating the I and Q signals using the at least one imbalance metric. In various embodiments, the detection signal is an envelope signal and the predetermined ranges of the I and Q digital values correspond with selection boxes at selected phases, such as, for example, 0, 45, 90, 135, 180, 225, 270, and 315 degrees.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventors of the present application have recognized the need for calibrating the modulator of a transmitter. They have therefore developed an on-signal quadrature modulator calibration system and method that calibrates the modulator in real-time while transmitting actual signals without the need for separate calibration cycles, as will be further described below with respect to FIGS. 1–13.

The present disclosure describes an on-signal quadrature modulator calibration scheme which uses a detector that senses information from the RF output signal that is used for calibration. The detection signal is fed back and processed to calculate one or more imbalance metrics, which are then used to calibrate the I and Q signals. DC, amplitude and phase imbalances are measured and calibrated. In one embodiment, a simple envelope detector is used as calibration feedback. Alternatively, a power detector is used. Only detector feedback monotonicity is necessary, and the present scheme converges more quickly with increased feedback linearity. The detection signal is sampled and the resulting digital samples, or derived power/magnitude values, are selected and sorted according to predetermined ranges of the I and Q values generated by the baseband processor. The predetermined ranges correspond to symmetrical selection boxes at optimal locations to measure the imbalances. An imbalance estimator determines one or more imbalance metrics which are used for calibration as further described herein.

A calibration scheme according to embodiments of the present invention operates during packet transmission rather than requiring separate calibration cycles. In particular embodiments specific to the IEEE 802.11 standard, the calibration scheme operates for 2 megabits per second (Mbps) DSSS payloads, 5.5 and 11 Mbps CCK payloads, and for OFDM packets. The envelope is preferably processed at 20 megahertz (MHz) for OFDM (IEEE 802.11a) and at 22 MHz for IEEE 802.11b. In the 802.11 schemes, the calibration is not performed during 1 Mbps DSSS preambles, headers or payloads since BPSK does not utilize the full I/Q plane. This is relatively inconsequential, however, since BPSK is significantly more robust than higher data modulations so that calibration is less critical.

Figure 1:
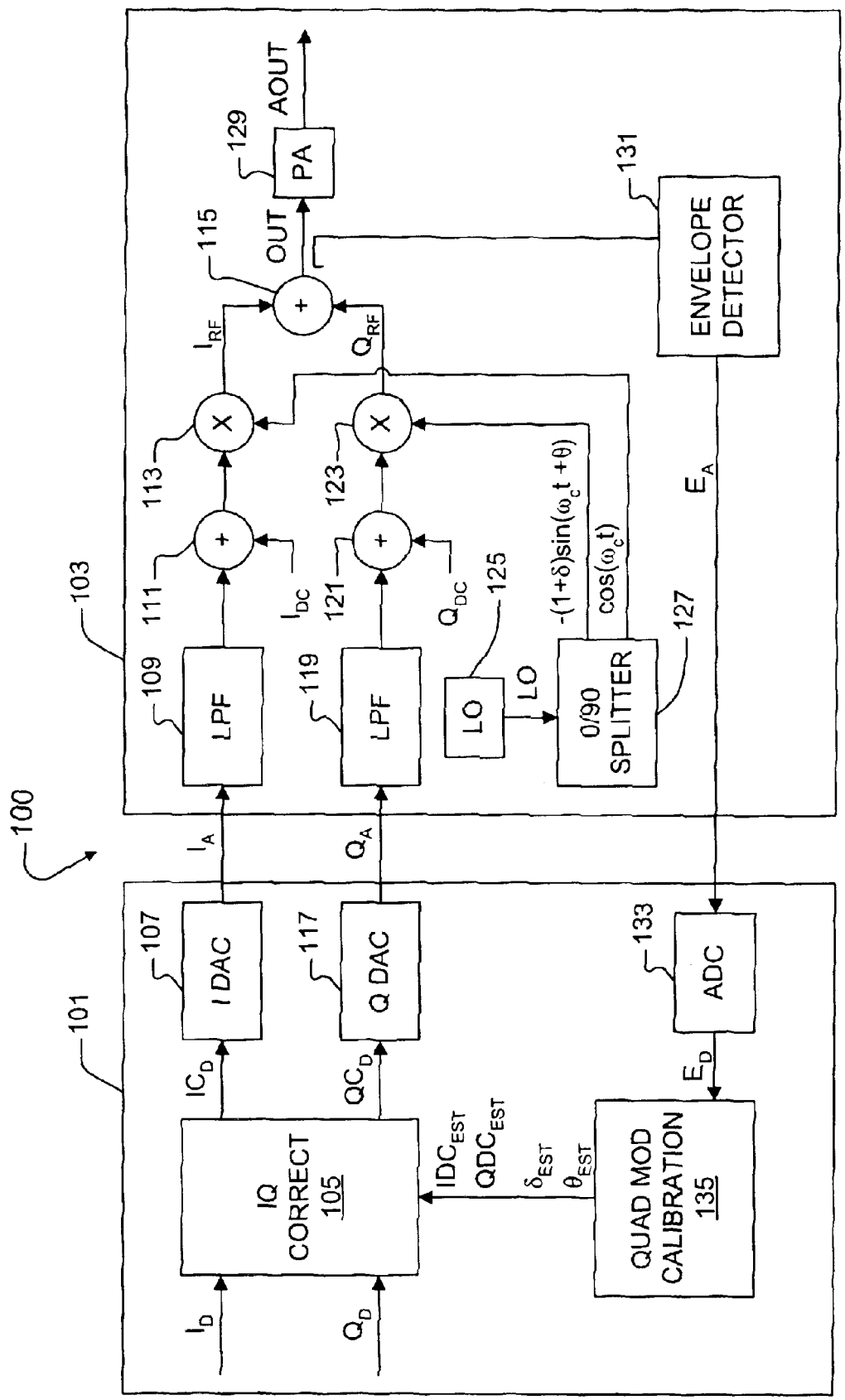
FIG. 1 is a simplified block diagram of a transmitter including on-signal quadrature modulator calibration implemented according to an exemplary embodiment of the present invention.

FIG. 1 is a simplified block diagram of a transmitter 100 including on-signal quadrature modulator calibration implemented according to an exemplary embodiment of the present invention. The present invention is illustrated using transmitters implemented according to the IEEE 802.11 family of standard(s) (including, for example, 802.11a, 802.11b and 802.11g) in a zero-intermediate frequency (ZIF) quadrature modulator (where ZIF is otherwise known as direct conversion), although it is understood that the present invention is applicable to other communication methods. The transmitter 100 includes a baseband processor 101 and an RF quadrature modulator 103. Only applicable portions of the transmitter are shown, in which other portions (e.g., receiver, media access control (MAC), antenna, etc.) are omitted as not necessary for providing a complete description of the invention.

The baseband processor 101 develops an in-phase digital signal $I_D$ and a quadrature-phase digital signal $Q_D$. In an ideal system, the $I_D$ signal is provided directly to an I-channel digital to analog converter (I DAC) 107 for converting to analog format, shown as $I_A$. The analog $I_A$ signal is then provided to one input of a mixer 113, which receives a modulating carrier signal $\cos(\omega_c t)$ at its other input. A local oscillator (LO) 125 generates an LO signal, which is provided to a 0/90 degree oscillator splitter 127. The oscillator splitter 127 generates the $\cos(\omega_c t)$ signal and another carrier signal $-\sin(\omega_c t)$ signal as known to those of ordinary skill in the art. The term $\omega_C=2\pi f_C$ measured in radians, where $f_C$ is the LO carrier frequency. The output radio frequency (RF) signal in the I signal path, $I_{RF}$, is provided to one input of a summing junction 115, which provides an RF output signal (OUT) at its output. A power amplifier 129 amplifies the OUT signal to a signal AOUT, which is amplified to the appropriate power level for transmission through the selected transmission medium.

The $Q_D$ signal is processed in a similar manner. In the ideal system, the $Q_D$ signal is provided directly to a Q-channel digital to analog converter (Q DAC) 117 for converting to analog format, shown as $Q_A$. The analog $Q_A$ signal is then provided to another LPF 119 within the quadrature modulator 103, which provides a filtered Q channel signal to one input of another mixer 123. The mixer 123 receives the carrier signal $-\sin(\omega_c t)$ at its other input from the oscillator splitter 127. The mixer 123 outputs a second RF signal in the Q signal path, shown as $Q_{RF}$. The $Q_{RF}$ signal is provided to the other input of the summing junction 115, which combines the $I_{RF}$ and $Q_{RF}$ signals to generate the OUT signal. In the 802.11 configuration illustrated, the OUT signal is amplified by the power amplifier 129 to AOUT, which is transmitted in a wireless medium via an antenna (now shown).

The quadrature modulator 103 is not ideal. An adder 111 is inserted in the I channel between the I DAC 107 and the mixer 113 denoting the addition of an undesired DC offset signal $I_{DC}$. Similarly, another adder 121 is inserted in the Q channel between the Q DAC 117 and the mixer 123 denoting the addition of an undesired DC offset signal $Q_{DC}$. The respective carrier signals are intended to be exactly 90 degrees out of phase and to have identical amplitudes. Real world devices, however, cause amplitude and phase imbalances which result in signal distortions. Amplitude and phase imbalances (distortions) are represented as modifying the $-\sin(\omega_c t)$ signal resulting in a distorted signal $-(1+\delta)\sin(\omega_c t+\theta)$, where the delta term "$\delta$" denotes an amplitude imbalance and the theta term "$\theta$" denotes a phase imbalance. Since the I and Q channels carry relative signals, the amplitude and phase imbalances are accurately represented in the Q channel as affecting the sinusoidal term at the mixer 123. The DC offsets, however, are illustrated as separate DC offsets added into the respective I and Q signal paths. At least one source of the amplitude and phase imbalances is the oscillator splitter 127, which generates the sine and cosine carrier waveforms with amplitude and phase discrepancies. The mixers 113 and 123 are also imperfect generating additional imbalances.

In the illustrated embodiment, an envelope detector 131 senses the OUT signal and provides a corresponding analog envelope $E_A$ signal to an analog-to-digital converter (ADC) 133 in the baseband processor 101. The envelope detector 131 extracts instantaneous amplitude information of the RF envelope of the OUT signal. The envelope detector 131 is relatively simple and easy to build in a low-cost manner, and may include a diode or rectifier or the like, such as a hot-carrier diode or full-wave rectifier. In one embodiment, the envelope detector 131 outputs absolute-value amplitude information so that the $E_A$ signal is always a positive value.

The ADC 133 samples and converts the analog $E_A$ signal into a corresponding stream of digital samples $E_D$, which is provided to a quadrature modulator calibration circuit 135. In one embodiment, the ADC 133 is configured to sample the $E_A$ signal at the appropriate sample rate corresponding to the signal type being transmitted, such as, for example, 20 MHz for OFDM signals or 22 MHz for IEEE 802.11b 5.5 and 11 Mbps CCK signals. The quadrature modulator calibration circuit 135 provides a set of distortion estimate signals to an IQ correction circuit 105 provided within the baseband processor 101. The distortion estimate signals include estimates of the distortion $I_{DC}$, $Q_{DC}$, $\delta$, and $\theta$, shown as $IDC_{EST}$, $QDC_{EST}$, $\delta_{EST}$, and $\theta_{EST}$, respectively. The IQ correction circuit 105 receives and modifies the digital $I_D$ and $Q_D$ signals into calibrated $IC_D$ and $QC_D$ signals prior to conversion to analog format by the I and Q DACs 107 and 117, respectively.

Figure 2:
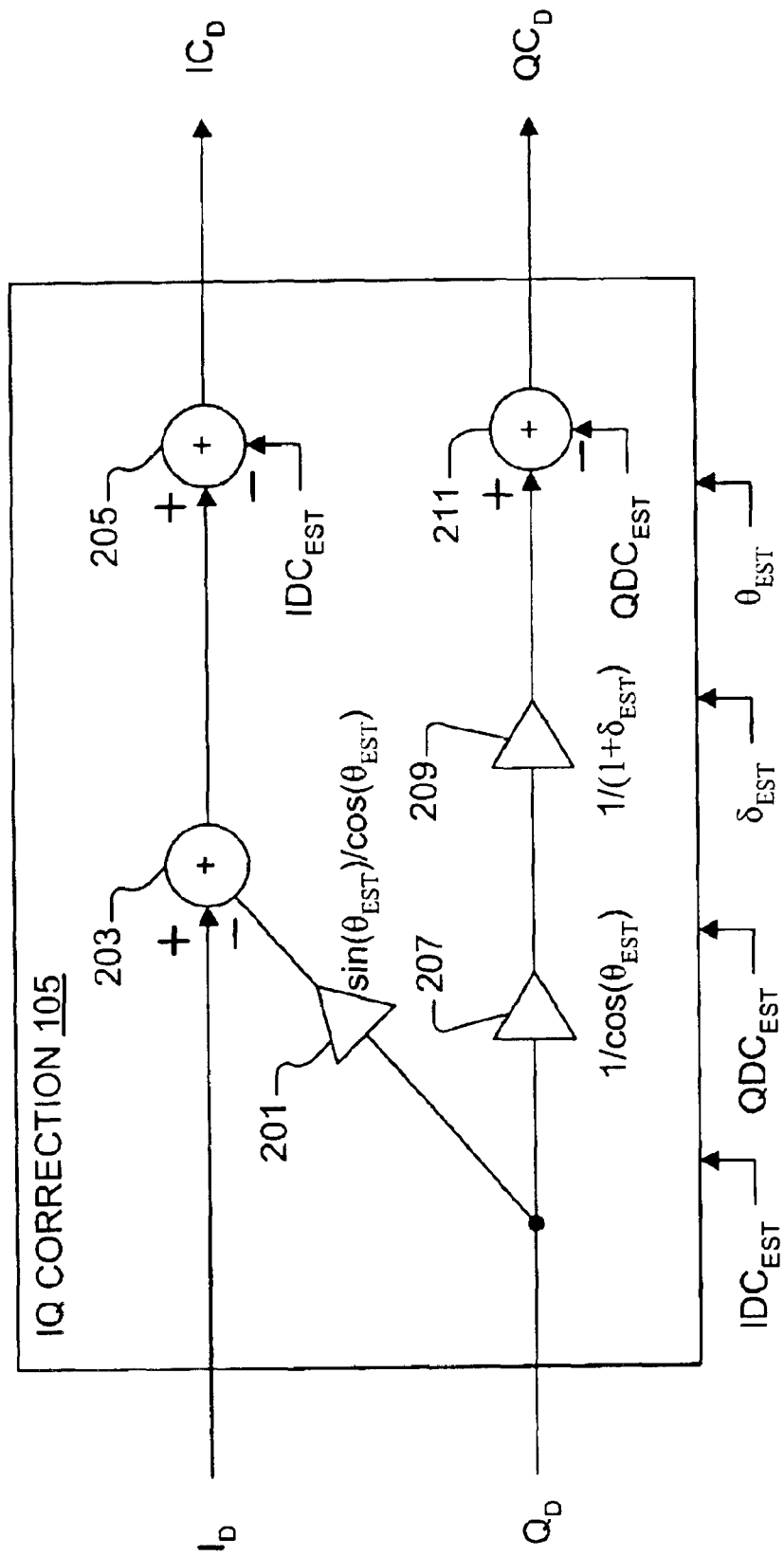
FIG. 2 is a more detailed block diagram of the IQ correction circuit of FIG. 1 shown in mathematical format.

FIG. 2 is a more detailed block diagram of the IQ correction circuit 105 shown in mathematical format. The IQ correction circuit 105 includes a combiner 201 that multiplies the $Q_D$ signal by a phase term $\sin(\theta_{EST})/\cos(\theta_{EST})$ and an adder 203 in the I signal path which subtracts the resulting value $Q_D \sin(\theta_{EST})/\cos(\theta_{EST})$ from the $I_D$ values. The output of the adder 203 is provided to the positive input of another adder 205, which subtracts the $IDC_{EST}$ value to remove the I channel DC offset. The output of the adder 205 provides the $IC_D$ digital signal. In the Q signal path, a first combiner 207 multiplies the $Q_D$ values by a phase term $1/\cos(\theta_{EST})$, and a second combiner 209 that multiplies the output of the combiner 207 by an amplitude term $1/(1+\delta_{EST})$. The output of the combiner 209 is provided to the positive input of another adder 211, which subtracts the $QDC_{EST}$ value to remove the Q channel DC offset. The output of the adder 211 provides the $QC_D$ digital values.

Figure 3:
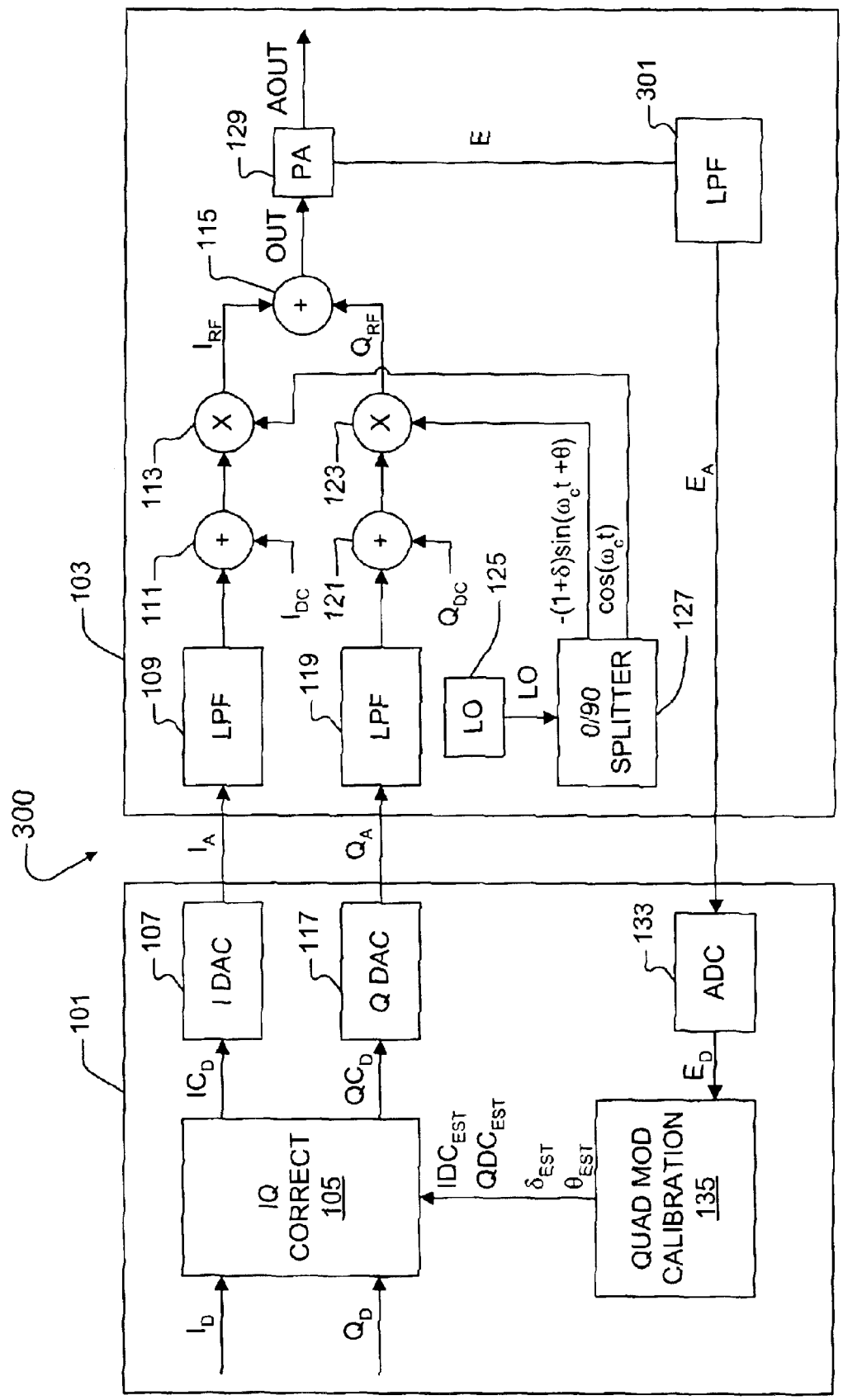
FIG. 3 is a block diagram of another transmitter including on-signal quadrature modulator calibration implemented according to an exemplary embodiment of the present invention.

FIG. 3 is a block diagram of another transmitter 300 including on-signal quadrature modulator calibration implemented according to an exemplary embodiment of the present invention. Similar elements and components as those of the transmitter 100 are given the same numeric designations. The transmitter 300 is substantially the same as the transmitter 100 except that the envelope detector 131 removed and a low-pass filter 301 is coupled directly to the power amplifier 129 for sensing an envelope of the AOUT signal, which is provided as an envelope signal E to the LPF 301. The LPF 301 filters the E signal and provides the $E_A$ signal to the ADC 133. The power amplifier 129 is implemented similar to many off-the-shelf amplifier devices and includes an output sensing device, such as a rectifier or diode or the like. In this manner, the built-in sensing device of the power amplifier 129 is employed to sense the AOUT signal rather than adding a separate envelope detector for detecting the OUT signal. A possible disadvantage of employing the output sensing device of the power amplifier 129 is that power amplifiers tend to be non-linear devices, so that it may incorporate additional distortion.

In yet another embodiment, the envelope detector 131 is replaced with a power detector (not shown) that provides a power signal which is proportional to the square of the corresponding envelope signal. The power signal may be generated from either the OUT signal or the AOUT signal and a LPF is used to filter the power signal. Depending upon the particular configuration, the power signal may be used directly or squared prior to further processing by the baseband processor 101. In the general case, an output signal detector senses a characteristic of the output signal and provides a characteristic signal, which incorporates the imbalance information used for purposes of calibration.

Figure 4A:
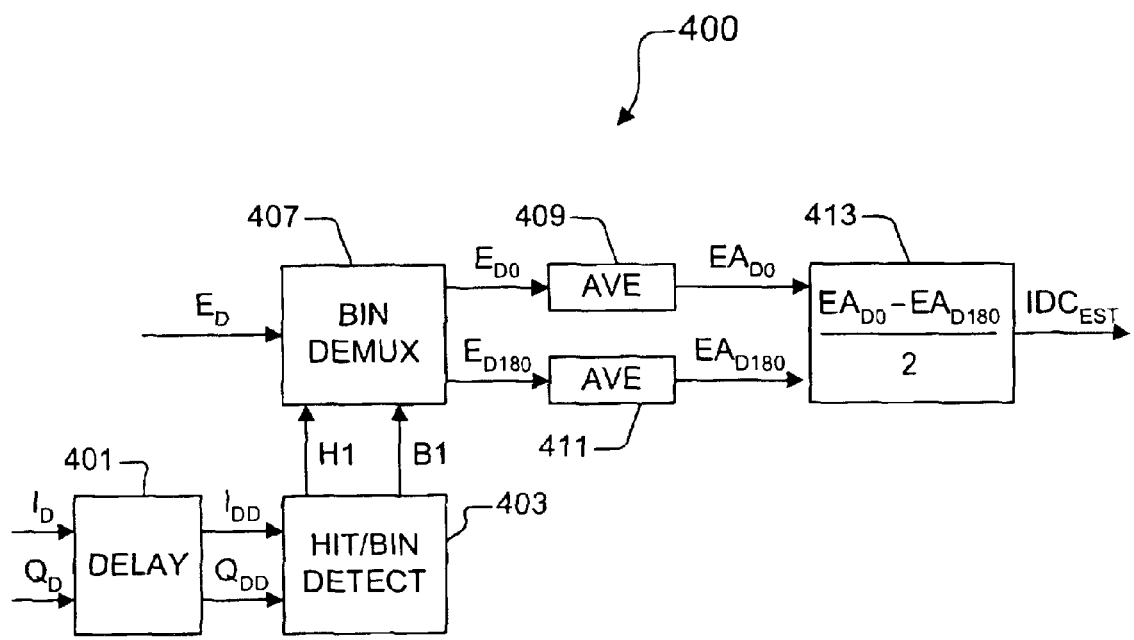
FIG. 4A is a block diagram of an exemplary circuit employed to estimate the I channel DC offset $I_{DC}$, where the circuit comprises a portion of the quadrature modulator calibration circuit of FIG. 1 according to one embodiment of the present invention.

FIG. 4A is a block diagram of an exemplary circuit 400 employed to estimate the I channel DC offset $I_{DC}$, where the circuit 400 comprises a portion of the quadrature modulator calibration circuit 135 according to one embodiment of the present invention. The $I_D$ and $Q_D$ digital values are provided to a digital delay block 401, which outputs delayed versions thereof, shown as $I_{DD}$ and $Q_{DD}$, respectively. The $I_{DD}$ and $Q_{DD}$ delayed digital values are provided to a HIT/BIN detection block 403, which selects $E_D$ samples according to a predetermined selection criterion based on the $I_{DD}$ and $Q_{DD}$ values.

Figure 4B:
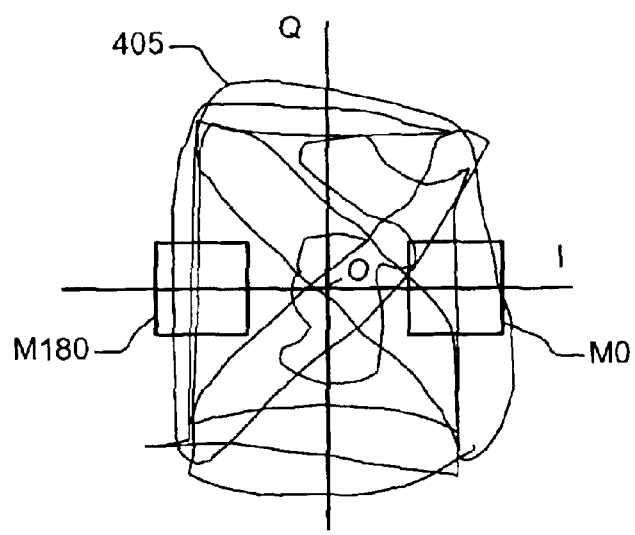
FIG. 4B is a graph diagram of a random modulation signal plotted on an I/Q graph illustrating the selection criterion employed by the detection block of FIG. 4A according to one embodiment of the present invention.

FIG. 4B is a graph diagram of a random modulation signal 405 plotted on an I/Q graph illustrating the selection criterion employed by the detection block 403 according to one embodiment. A pair of symmetrical selection boxes M0 and M180 are shown super-imposed on the graph on either side of the graph origin O along the I axis. The selection boxes M0 and M180 are approximately equidistant from the origin and have approximately the same size and shape. In particular, box M0 is at 0 degrees on the positive I side and box M180 is at 180 degrees on the negative I side. The selection criterion is that samples falling within the boxes M0 and M180 are used for $I_{DC}$ calibration and the samples falling outside the box are rejected for purposes of $I_{DC}$ calibration.

The selection box M0 is located at phase 0 degrees and the selection box M180 is located at phase 180 degrees along the I axis. The height and width of the selection boxes corresponding to predetermined ranges of the I and Q digital values to optimize a determination of the I DC offset. The width of each of the selection boxes M0 and M180 along the I axis is determined to ensure that a sufficient number of samples are collected given expected real-time sample values over time within a predetermined amount of error based on expected or otherwise experimentally-determined levels of distortion. The height of the selection boxes M0 and M180 above and below the I axis in the positive and negative Q directions is selected sufficiently small to ensure valid samples intended to be located on or near the I axis within a predetermined amount of error based on the expected levels of distortion. The width and height of the selection boxes M0 and M180 are not shown to scale; the height may be chosen to be significantly smaller compared to the width.

In general, it is determined that the average value of the magnitudes of the $E_D$ samples corresponding to the selection box M0 will be approximately equal to the magnitude of the $E_D$ samples corresponding to the selection box M270, if $I_{DC}$ is negligible or zero and if the boxes are approximately the same size and shape and are symmetrically located. A discrepancy between the average values is proportional to the amount of $I_{DC}$ of the signal.

The detection block 403 operates as a selector with a gating function in which it asserts a hit signal H1 for each time the $I_{DD}$ and $Q_{DD}$ values define a point that when plotted is located within either of the selection boxes M0 and M180. The detection block 403 asserts a bin signal B1 that identifies one of the selection boxes M0 and M180 in which the hit occurred. A bin de-multiplexer 407 selects each $E_D$ sample when indicated as a "hit" by the H1 signal asserted by the detection block 403. The bin de-multiplexer 407 sorts selected samples into two "bins", including a first bin corresponding to samples for the selection box M0 and a second bin corresponding to samples for the selection box M180 as indicated by the B1 signal.

As previously described, the $I_D$ and $Q_D$ digital values are converted to analog signals which are processed and filtered within the quadrature modulator 203 to develop the RF output signals. The selected output signal is monitored by the envelope detector 131 or the like to provide the $E_A$ signal, which is then sampled by the ADC 133 to provide the $E_D$ digital samples. The approximate delay of the processing loop between the $I_D$ and $Q_D$ values and the corresponding $E_D$ samples is compensated by the digital delay block 401, which outputs the delayed $I_{DD}$ and $Q_{DD}$ values. In this manner, the timing of the $I_{DD}$ and $Q_{DD}$ values approximately corresponds to the timing of the $E_D$ samples at the bin de-multiplexer 407. The amount of delay depends upon the particular configuration and implementation of the baseband processor 101 and the quadrature modulator 103 and the particular signal being transmitted. In one embodiment specific to an OFDM signal samples at 20 MHz, for example, it was determined using correlation results that the delay is approximately 7 sample times (e.g., approximately 350 nanoseconds (ns) when each sample time is approximately 50 ns) between the $I_D$, $Q_D$ values and the corresponding $E_D$ samples. In one embodiment, for example, the delay box 401 is implemented using a first-in, first-out (FIFO) set of 7 shift registers in which each register is sufficiently large to store a pair of $I_D$, $Q_D$ values. Thus, the $I_D$, $Q_D$ values are delayed by 7 samples and the corresponding $I_{DD}$ and $Q_{DD}$ values provided to the detection block 403. It is appreciated that other delay methods may be employed, including more accurate delay methods to arrive at a more accurate correlation, as further described below.

The bin de-multiplexer 407 outputs a first set of selected samples $E_{D0}$ corresponding to the selection box M0 and outputs a second set of selected samples $E_{D180}$ corresponding to the selection box M180. The $E_{D0}$ samples are filtered or otherwise averaged by a first average block 409 for providing a first sample average $EA_{D0}$ for the selection box M0 and a second sample average $EA_{D180}$ for the selection box M180. The $EA_{D0}$ and $EA_{D180}$ values are used to derive the IDC$_{EST}$ value, which is an estimate of the I channel DC offset. In particular, one-half of the difference between the first and second sample averages E$_{AD0}$ and EA$_{D180}$ is determined at calculator block 413, which outputs the IDC-$_{EST}$ value. The IDC$_{EST}$ value is an estimate of the I channel DC offset I$_{DC}$, so that the IDC$_{EST}$ value is subtracted from the I signal path in the IQ correction circuit 105 to remove the I channel DC offset. Each time a hit occurs, the corresponding E$_{DO}$ or E$_{D180}$ value is updated, the corresponding EA$_{DO}$ or EA$_{D180}$ value is updated, and the IDC$_{EST}$ value is updated to track the I DC offset.

Figure 5A:
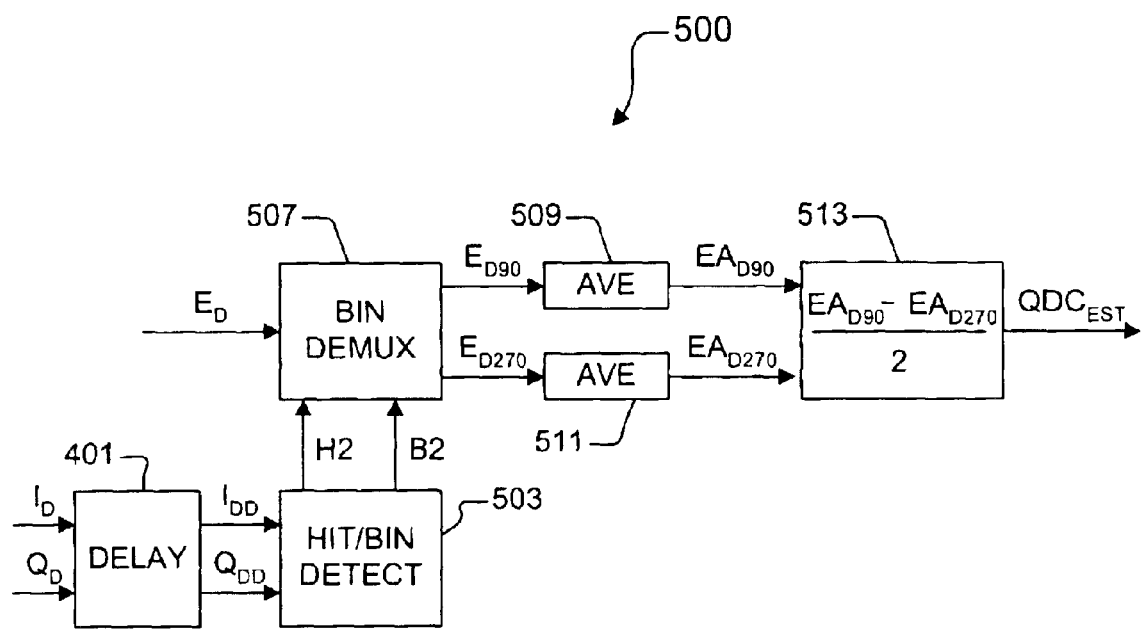
FIG. 5A is a block diagram of an exemplary circuit employed to estimate the Q channel DC offset $Q_{DC}$, where the circuit comprises a portion of the quadrature modulator calibration circuit of FIG. 1 according to one embodiment of the present invention.

FIG. 5A is a block diagram of an exemplary circuit 500 employed to estimate the Q channel DC offset Q$_{DC}$, where the circuit 500 comprises a portion of the quadrature modulator calibration circuit 135 according to one embodiment of the present invention. The circuit 500 is substantially the same as the circuit 400 except modified to measure Q$_{DC}$ rather than I$_{DC}$. In this case, the detection block 403 is replaced with detection block 503, which operates in a similar manner but with a modified selection criterion specific to measuring Q$_{DC}$. Again, the I$_{DD}$ and Q$_{DD}$ values are provided to the detection block 503, which outputs a hit signal H2 and a bin signal B2 collectively used to select E$_D$ samples.

Figure 5B:
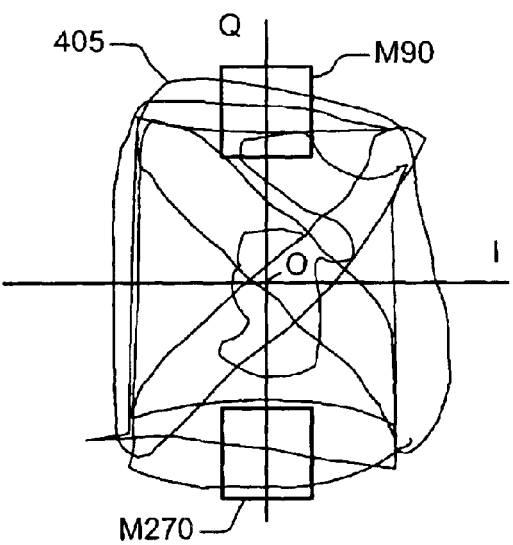
FIG. 5B is a graph diagram of the random modulation signal plotted on the I/Q graph illustrating the selection criterion employed by the detection block of FIG. 5A.

FIG. 5B is a graph diagram of the random modulation signal 405 plotted on the I/Q graph illustrating the selection criterion employed by the detection block 503. A pair of symmetrical selection boxes M90 and M270 are shown super-imposed on the graph on either side of the graph origin O along the Q axis. The selection boxes M90 and M270 are approximately equidistant from the origin and have approximately the same size and shape. In particular, box M90 is at 90 degrees on the positive Q side and box M270 is at 270 degrees (or −90 degrees) on the negative Q side. The selection criterion is that samples falling within the boxes M90 and M270 are used for Q$_{DC}$ calibration and the samples falling outside the box are rejected for purposes of Q$_{DC}$ calibration.

The selection box M90 is located at phase 90 degrees and the selection box M180 is located at phase 180 degrees along the Q axis. The height and width of the selection boxes corresponding to predetermined ranges of the I and Q digital values to optimize a determination of the Q DC offset. @In one embodiment, the selection boxes M90 and M270 are substantially the same size and shape as the selection boxes M0 and M180, except rotated by 90 degrees. For example, the width of the selection boxes M90 and M270 along the Q axis is determined to ensure that a sufficient number of samples are collected given expected real-time sample values over time within a predetermined amount of error based on expected levels of distortion. The "height" of the selection boxes M90 and M270 on either side of the Q axis in the positive and negative I directions is selected sufficiently small to ensure valid samples intended to be located along the Q axis within a predetermined amount of error based on the expected levels of distortion.

In general, it is determined that the average value of the magnitudes of the E$_D$ signal samples corresponding to the selection box M90 will be approximately equal to the magnitude of the E$_D$ signal samples corresponding to the selection box M270, if Q$_{DC}$ is negligible or zero and if the boxes are approximately the same size and shape and are symmetrically located. A discrepancy between the average values is proportional to the amount of Q$_{DC}$ of the signal.

The H2 and B2 signals are provided to a bin de-multiplexer 507, which operates in substantially the same manner as the bin de-multiplexer 407 by selecting each sample of the E$_D$ signal when indicated as a "hit" by the H2 signal asserted by the detection block 503. The B2 signal identifies the corresponding selection box M90 or M270 in a similar manner as the B1 signal. The bin de-multiplexer 507 also sorts selected samples into two "bins", including a first bin corresponding to samples for the selection box M90 and a second bin corresponding to samples for the selection box M270. The bin de-multiplexer 507 outputs first selected samples E$_{D90}$ corresponding to the selection box M90 and outputs second selected samples E$_{D270}$ corresponding to the selection box M270. The E$_{D90}$ samples are filtered or otherwise averaged by a first average block 509 for providing a first sample average EA$_{D90}$ for the selection box M90 and a second sample average EA$_{D270}$ for the selection box M270. The EA$_{D90}$ and EA$_{D270}$ values are used to derive an estimate of Q$_{DC}$. In particular, one-half of the difference between the first and second sample averages EA$_{D90}$ and EA$_{D270}$ is determined at calculator block 513, which outputs the Q channel DC estimate QDC$_{EST}$, which is an estimate of the Q channel DC offset. The QDC$_{EST}$ value is subtracted from the Q signal path in the IQ correction circuit 105 in an attempt to remove the Q channel DC offset. Each time a hit occurs, the corresponding E$_{D90}$ or E$_{D270}$ value is updated, the corresponding EA$_{D90}$ or EA$_{D270}$ value is updated, and the QDC$_{EST}$ value is updated to track the Q DC offset.

Figure 6A:
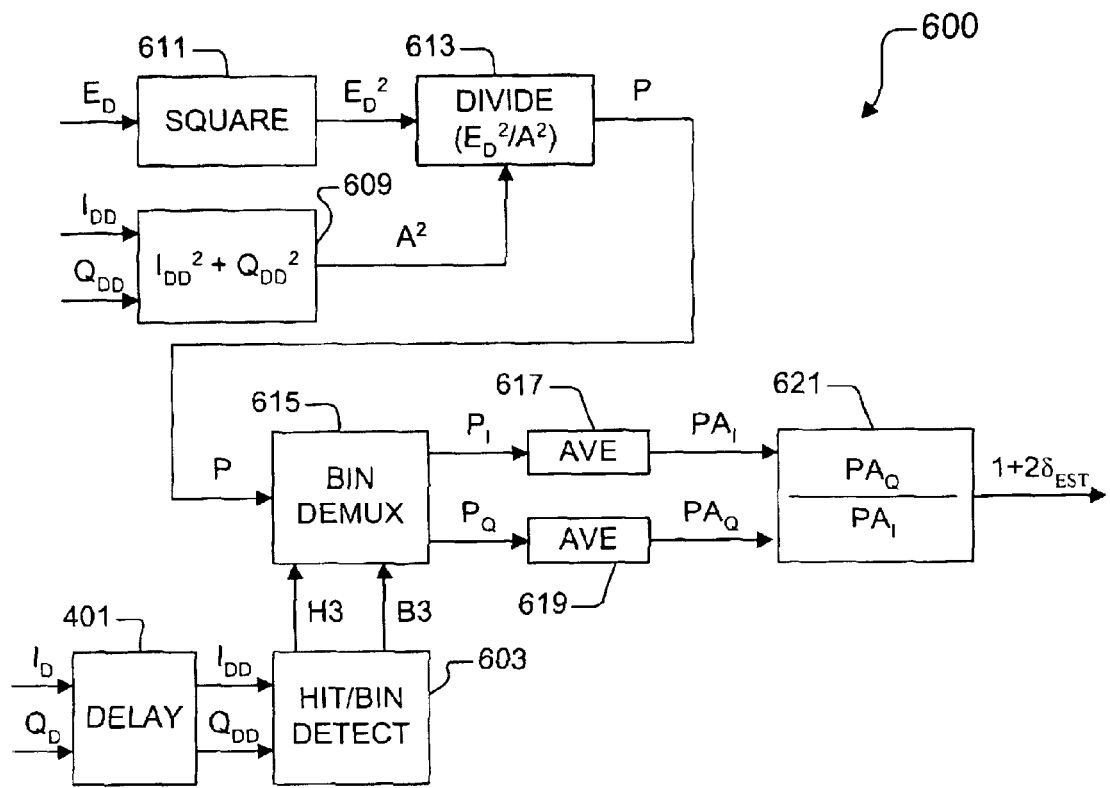
FIG. 6A is a block diagram of an exemplary circuit employed to estimate the amplitude distortion delta term "δ", where the circuit comprises a portion of the quadrature modulator calibration circuit of FIG. 1 according to one embodiment of the present invention.

FIG. 6A is a block diagram of an exemplary circuit 600 employed to estimate the amplitude distortion delta term "δ", where the circuit 600 comprises a portion of the quadrature modulator calibration circuit 135 according to one embodiment of the present invention. The I$_{DD}$ and Q$_{DD}$ values from the delay block 401 are provided to a HIT/BIN detection block 603, which selects E$_D$ samples according to a predetermined selection criterion based on the I$_{DD}$ and Q$_{DD}$ values.

Figure 6B:
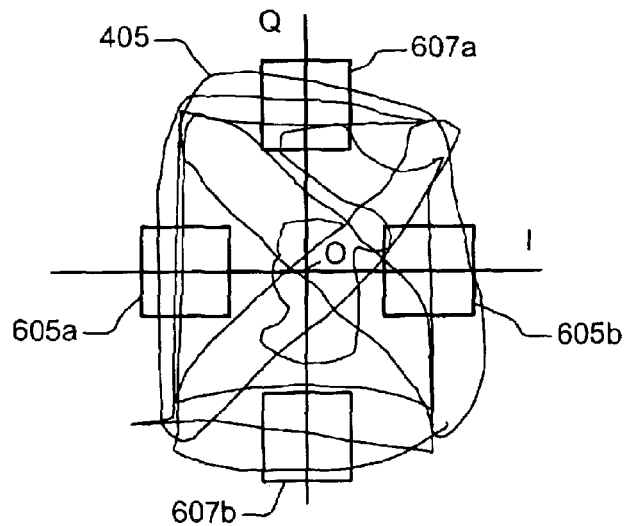
FIG. 6B is a graph diagram of the random modulation signal plotted on an I/Q graph illustrating the selection criterion employed by the detection block of FIG. 6A.

FIG. 6B is a graph diagram of the random modulation signal 405 plotted on an I/Q graph illustrating the selection criterion employed by the detection block 603. In this case, two pairs of symmetrical selection boxes are shown, including a first pair 605a and 605b positioned on either side of the origin O along the I axis and another pair 607a and 607b above and below the origin along the Q axis. In one embodiment, the selection boxes 605a,b and 607a,b are configured in substantially the same manner as the selection boxes M0, M180 and M90, M270, respectively, as previously described. The detection block 603 asserts a hit signal H3 and a bin signal B3 in a similar manner as the H1, B1 and H2, B2 signals when a E$_D$ sample falls within any of the selection boxes. For the circuit 600, the B3 signal indicates only one of two bins, including a first bin for hits within either of the selections boxes 605a and 605b and another bin for hits within either of the selection boxes 607a and 607b. In other words, a hit in either of the selection boxes 605a or 605b is sorted to a first bin and a hit in either of the selection boxes 607a or 607b is sorted to a second bin.

The I$_{DD}$ and Q$_{DD}$ values from the delay block 401 are also provided to an amplitude square block 609, which outputs amplitude squared values A$^2$=I$_{DD}^2$+Q$_{DD}^2$. In one embodiment, each of the I$_{DD}$ and Q$_{DD}$ values are separately squared and then added together to calculate A$^2$. It is appreciated, however, that the I$_{DD}$ and Q$_{DD}$ values are known according to a selected modulation scheme, so that every possible combination of A$^2$ may be pre-calculated and stored in a memory. In an efficient circuit implementation, for example, the amplitude square block 609 is configured as a lookup table in which each pair of I$_{DD}$ and Q$_{DD}$ values are used as index values applied to the lookup table, which outputs the corresponding pre-stored $A^2$ value. The $E_D$ samples are also squared in a separate square block 611, which outputs corresponding $E_D^2$ values. The $A^2$ values and corresponding $E_D^2$ values are provided to a divide block 613, which divides each $E_D^2$ value by its corresponding $A^2$ value, and outputs corresponding power values P to a bin de-multiplexer block 615. The blocks 609, 611 and 613 collectively form a power circuit for determining the power values P.

The bin de-multiplexer block 615 selects the P values that are indicated as a hit by the H3 signal and sorts into two bins according to the B3 signal, and outputs the selected P values as $P_I$ power values if the hit was within the selection boxes 605a or 605b or as $P_Q$ power values if the hit was within the selection boxes 607a or 607b. The set of $P_I$ power values are averaged by average block 617 and the set of $P_Q$ power values are averaged by average block 619, and the averaged power values $PA_Q$ and $PA_I$ are provided to a power divide block 621, which calculates $PA_Q/PA_I \approx 1+2\delta_{EST}$. As previously described, the $\delta_{EST}$ term is an estimate of the amplitude distortion term and "$\approx$" denotes an approximation. The corresponding $\delta_{EST}$ term is determined by subtracting 1 from each $PA_Q/PA_I$ value and then dividing by 2, where the resulting $\delta_{EST}$ terms are then provided to the IQ correction circuit 219 for amplitude compensation. It is noted that since the output values $(1+2\delta_{EST})$ are provided in digital form, it is a relatively simple matter of determining the $\delta_{EST}$ term by decrementing a register by 1 and shifting to divide by 2.

Figure 7:
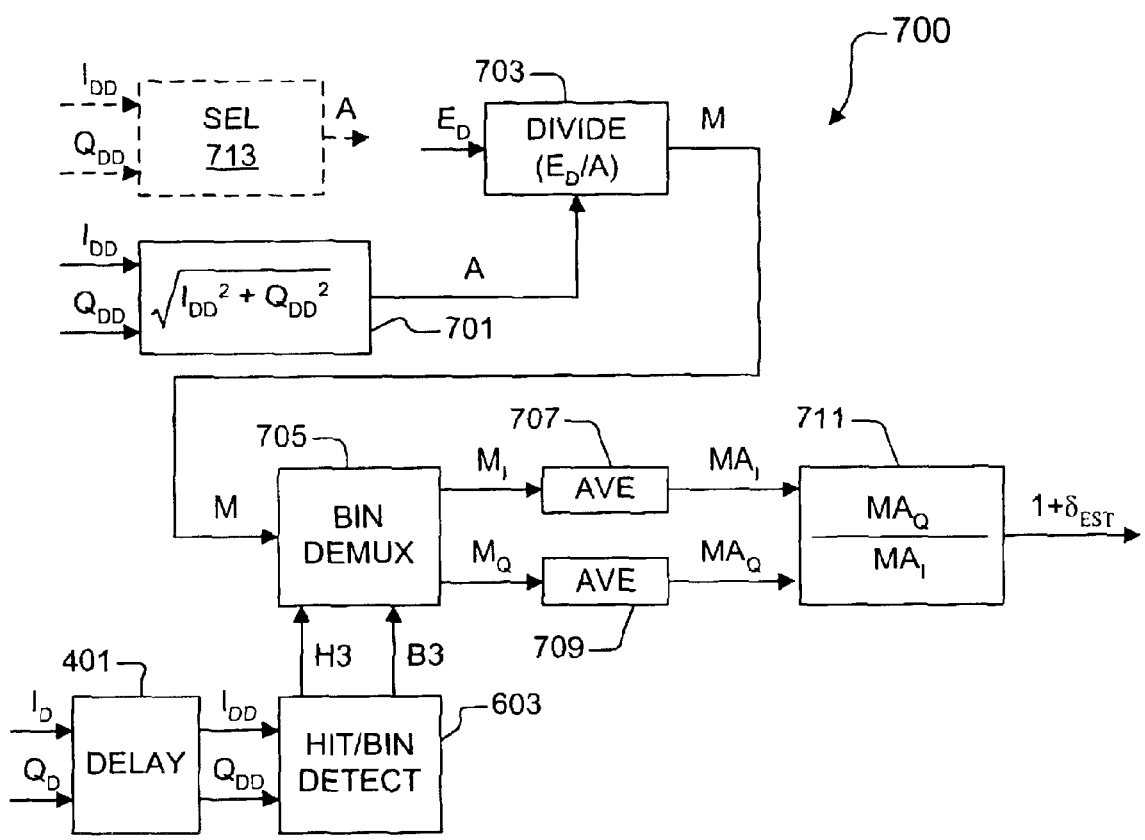
FIG. 7 is a block diagram of another exemplary circuit employed to approximate the amplitude distortion delta term δ according to an alternative embodiment of the present invention.

FIG. 7 is a block diagram of another exemplary circuit 700 employed to approximate the amplitude distortion delta term $\delta$ according to an alternative embodiment of the present invention. The circuit 700 is an alternative to and somewhat simplified version of the circuit 600 for calculating the amplitude distortion delta term $\delta_{EST}$. The delay block 401 and detection block 603 are used in a similar manner for generating the H3 and B3 signals. In this case, the $I_{DD}$ and $Q_{DD}$ values from the delay block 401 are provided to an amplitude block 701, which outputs amplitude values $A=SQRT(I_{DD}^2+Q_{DD}^2)$, where "SQRT" denotes the square-root mathematical function. In one embodiment, each A value is calculated by separately squaring each $I_{DD}$ value and $Q_{DD}$ value, adding the results together and then taking the square root. In another, more efficient implementation, the amplitude block 701 is configured as a lookup table in which the $I_{DD}$ and $Q_{DD}$ values are used as index values applied to the lookup table, which outputs the corresponding pre-stored A value. The A values and corresponding $E_D$ values are provided to a divide block 703, which divides each $E_D$ value by its corresponding A value, and outputs corresponding magnitude values M to a bin de-multiplexer block 705. The blocks 701 and 703 collectively form a magnitude circuit for providing the magnitude values M.

The bin de-multiplexer block 705 selects the M values that are indicated as a hit by the H3 signal, sorts into two bins according to the B3 signal, and outputs the M values as $M_I$ magnitude values for hits within either of the selection boxes 605a or 605b or as $M_Q$ magnitude values for hits within the either of the selection boxes 607a or 607b as indicated by the B3 signal. The $M_I$ values are averaged by average block 707 and the $M_Q$ values are averaged by average block 709, and the averaged magnitude values $MA_I$ and $MA_Q$ are provided to a magnitude divide block 711, which calculates $MA_Q/MA_I \approx 1+\delta_{EST}$. The corresponding $\delta_{EST}$ term may be determined by subtracting 1 from each $MA_Q/MA_I$ value, where the resulting $\delta_{EST}$ terms are then provided to the IQ correction circuit 135 for amplitude compensation. Alternatively, the $1+\delta_{EST}$ values may be used directly without further modification. The circuit 700 is potentially a more efficient implantation than the circuit 600 since the square block 611 is eliminated and the output values $(1+\delta_{EST})$ may be used without modification.

The circuit 700 may be modified by replacing the amplitude block 701 with a selection block 713, shown in dashed lines. The selection block 713 selects the $I_{DD}$ value when the hit occurs within the selection boxes 605a or 605b and selects the $Q_{DD}$ value when the hit occurs within the selection boxes 607a or 607b. The selection block 713 is sufficiently accurate when the selection boxes 605a and 605b incorporate relatively small or otherwise negligible $Q_{DD}$ values and when the selection boxes 607a and 607b incorporate relatively small or otherwise negligible $I_{DD}$ values. The selection block 713 incorporates relatively simple logic and may be preferable to the logic calculation or lookup table implementations of the amplitude block 701.

Figure 8A:
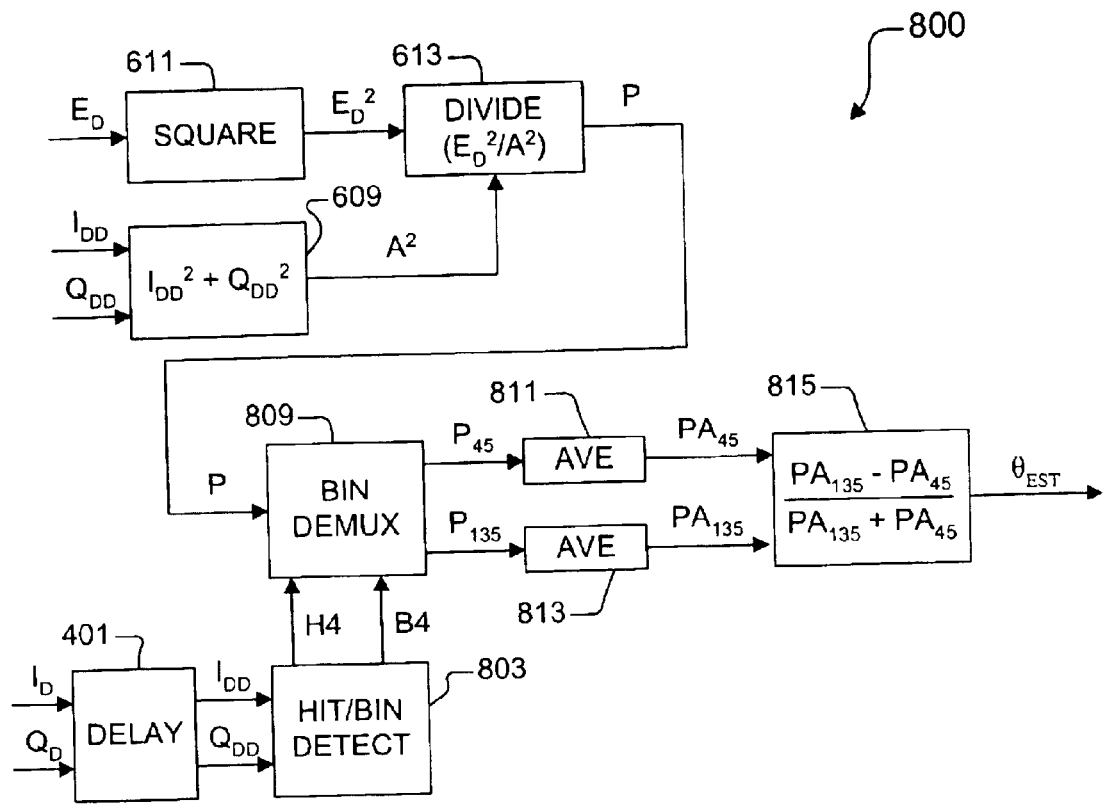
FIG. 8A is a block diagram of an exemplary circuit employed to estimate the phase distortion theta term "θ", where the circuit comprises a portion of the quadrature modulator calibration circuit of FIG. 1 according to one embodiment of the present invention.

FIG. 8A is a block diagram of an exemplary circuit 800 employed to estimate the phase distortion theta term "$\theta$", where the circuit 800 comprises a portion of the quadrature modulator calibration circuit 135 according to one embodiment of the present invention. The circuit 800 is similar to the circuit 600 in which similar components assume identical reference numbers. In particular, the delay block 401, the amplitude square block 609, the square block 611 and the divide block 613 operate in substantially the same manner in which the divide block 613 outputs power sample values P as previously described. The $I_{DD}$ and $Q_{DD}$ values from the delay block 401 are provided to a detection block 803, which selects samples according to a predetermined selection criterion.

Figure 8B:
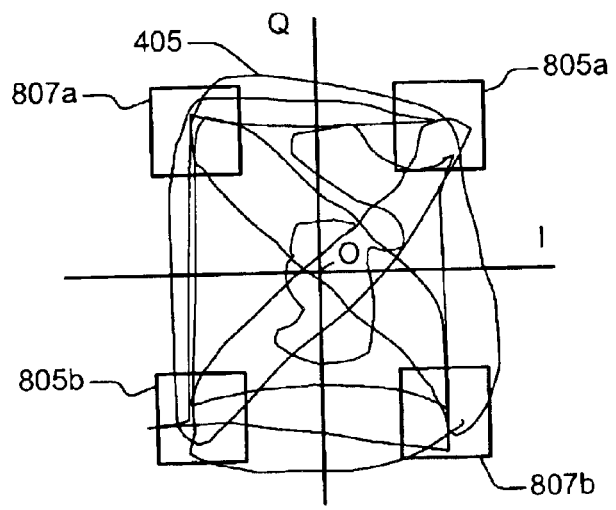
FIG. 8B is a graph diagram of the random modulation signal plotted on an I/Q graph illustrating the selection criterion employed by the detection block of FIG. 8A.

FIG. 8B is a graph diagram of the random modulation signal 405 plotted on an I/Q graph illustrating the selection criterion employed by the detection block 803. Again, two pairs of selection boxes are shown, including a first pair 805a and 805b positioned along a 45 degree axis on either side of the origin O in symmetrical fashion, and another pair 807a and 807b positioned along a 135 degree axis on either side of the origin O in symmetrical fashion. More particularly, the selection box 805a is at a phase of 45 degrees, the selection box 807a is at a phase of 135 degrees, the selection box 805b is at a phase of 225 degrees (or −135 degrees), and the selection box 807b is at a phase of 315 degrees (or −45 degrees). In one embodiment, the selection boxes 805a,b and 807a,b are configured in a similar manner as the selection boxes 605a,b and 607a,b as previously described. Alternatively, the selection boxes 805a,b and 807a,b may have more of a square shape in which their heights and widths are more equal. In any event, the symmetrical selection boxes are selected to optimize a determination of the phase imbalance in the output signal.

The detection block 803 asserts a hit signal H4 and a bin signal B4 when a sample falls within any of the selection boxes 805a,b and 807a,b. The B4 signal indicates only one of two bins, including a first bin for either of the selections boxes 805a and 805b and a second bin for either of the selection boxes 807a and 807b. In other words, a hit in either of the selection boxes 805a or 805b is sorted to a first bin and a hit in either of the selection boxes 807a or 807b is sorted to a second bin as indicated by the B4 signal.

The P power values from the divide block 613 are provided to a bin de-multiplexer block 809, which receives the H4 and B4 signals. The bin de-multiplexer block 809 selects the P values that are indicated as a hit and sorts into two bins, and outputs selected P values as $P_{45}$ power values if the hit was within the selection boxes 805a or 805b or as $P_{135}$ power values if the hit was within the selection boxes 807a or 807b. The $P_{45}$ power values are averaged by average block 811 and the $P_{135}$ power values are averaged by average block 813. The averaged power values $PA_{45}$ and $PA_{135}$ are provided to a differential divide block 815, which calculates corresponding estimated phase distortion theta terms $\theta_{EST}=(PA_{135}-PA_{45})/(PA_{135}+PA_{45})$. The $\theta_{EST}$ terms are estimates of the phase distortion theta term $\theta$, which are provided to the IQ correction circuit 105 for phase compensation.

Figure 9:
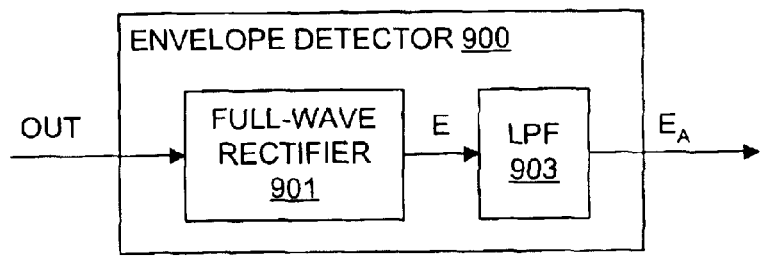
FIG. 9 is a block diagram of an exemplary embodiment of an envelope detector that may be used as the envelope detector of FIG. 1.

FIG. 9 is a block diagram of an exemplary embodiment of an envelope detector 900 that may be used as the envelope detector 131. The envelope detector 900 includes a full-wave rectifier 901 receiving the OUT signal and providing an unfiltered envelope signal E to a low-pass filter (LPF) 903. The LPF 903 is configured with a wide enough frequency range to pass the desired envelope of the OUT signal, and outputs the $E_A$ signal. As previously described, the $E_A$ signal is sampled and converted to the digital $E_D$ signal by the ADC 133. The sample rate of the ADC 133 is selected to correspond with the signal type being transmitted. Different sample rates may be used if rate-change filtering is applied in the transmit signal path as known to those of ordinary skill in the art.

Figure 10:
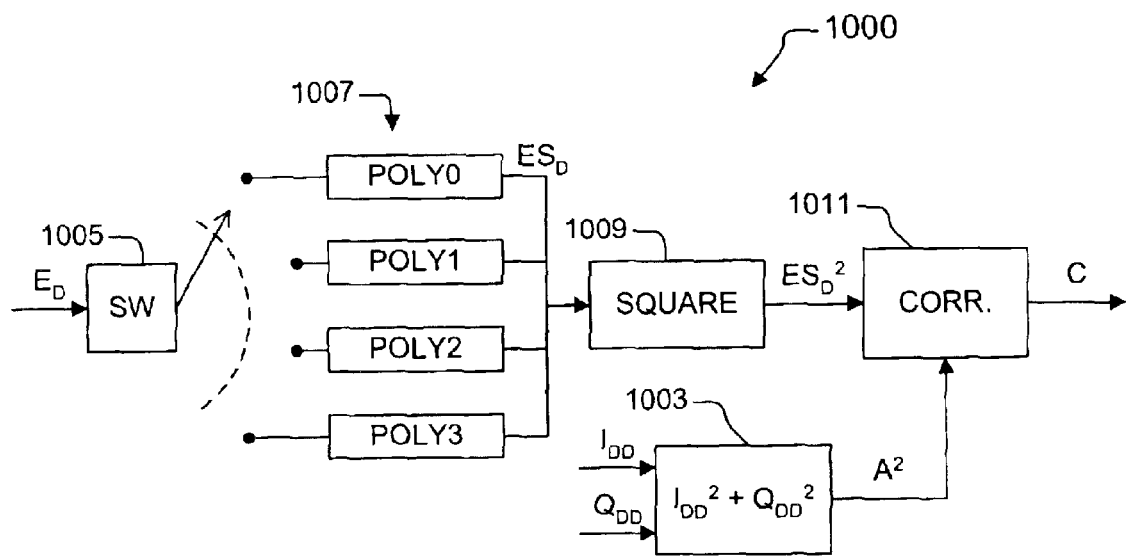
FIG. 10 is a block diagram of an exemplary correlation circuit that is used in alternative embodiments to achieve more accurate time alignment using polyphase filters.

FIG. 10 is a block diagram of an exemplary correlation circuit 1000 that is used in alternative embodiments to achieve more accurate time alignment using polyphase filters 1007. The amount of delay through the analog RF modulator and associated filters may not be precisely aligned with $E_D$ samples from the ADC 215. In a worst case scenario, the $E_D$ samples may be aligned in time in the middle of the corresponding $I_{DD}$ and $Q_{DD}$ delayed values. For example, rather than a 7 sample time delay, the delay may be a time corresponding to 6.5 or 7.5 sample times, which may lead to inaccurate results since the digital samples in the feedback compensation loop are not aligned. One solution is to configure the delay block 401 to be adjustable between minimum and maximum expected delay increments, set the delay increment to just above the actual delay when measured, and then add a fractional delay device in the feedback path using a filter or an interpolator or the like. The fractional delay device is able to shift the delay time by less than a full sample time to achieve more precise alignment. For example, if it is expected that the delay for a given configuration ranges between approximately 6 and 8 sample times give or take a sample, the delay block 401 is configured to be programmable within a range of sample times, such as between 5 and 9 sample times. The actual delay is measured and the delay block 401 is programmed to the incremental delay just greater than the actual delay. If the delay is measured at 6.5 sample times, for example, then the delay block 401 is programmed with a 7 sample delay. The fractional sample delay device in the feedback path is then adjusted and programmed with a fractional sample delay as close as possible to the difference between the actual delay and the programmed delay of the delay block 401, e.g., 0.5 sample time, so that the differential between the delays provides more precise timing alignment.

In the embodiment shown, the $I_{DD}$ and $Q_{DD}$ values from the delay block 401 are provided to an amplitude square block 1003, which operates in substantially the same way as the amplitude square block 609 for generating the amplitude square values $A^2$. The $E_D$ samples from the ADC 215 are provided through a switch 1005 to the input of a selected one of multiple polyphase filters 1007. Each of the polyphase filters 1007 is configured with a different delay, where each delay is a fraction of a full sample time. As shown, for example, four separate polyphase filters POLY0, POLY1, POLY2 and POLY3 provide four different fractional sample delay amounts. It is appreciated that any number of polyphase filters may be employed depending upon the desired level of accuracy. The output of each of the polyphase filters 1007 provides shifted $ES_D$ samples, which are provided to a square block 1009. The square block 1009 operates in a similar manner as the square block 611 for providing $ES_D^2$ values, which are provided to a correlator 1011. The correlator 1011 receives the $A^2$ values and outputs correlation results C. The correlation results C are monitored to find the best correlation results, which is usually in the form of the largest magnitude output.

Several configurations are contemplated for implementing the correlation circuit 1000 within the transmitter circuit for enabling more precise timing control. In one configuration for integrated circuits (ICs), the switch 1005 and the polyphase filters 1007 are inserted in the baseband processor 101 between the ADC 133 and the quadrature modulator calibration circuit 135. The switch 1005 is externally controllable by the test system to enable selection of the polyphase filters 1007. In one embodiment, the correlator 1011 is also incorporated on-chip, such as the at the outputs of the square block 611 and the amplitude square block 609, and the output of the correlator 1011 is externally available to monitor timing results. Alternatively, the outputs of the square block 611 the amplitude square block 609 are externally available and connected to an external correlator (not shown). At manufacture time, the transmitter chip is tested to adjust timing in which the delay block 401 and the switch 1005 are controlled and the correlation results monitored. During test, the polyphase filters 1007 are selected one at a time to process multiple samples. The polyphase filter that provides the best correlation results (e.g., largest correlation values) is selected for the part under test. Once determined, the delay block 401 and the switch 1005 are programmed to achieve the best timing alignment. Such programming may be achieved using an standard method, such as, for example, fuse blowing or EPROM programming or the like.

Figure 11:
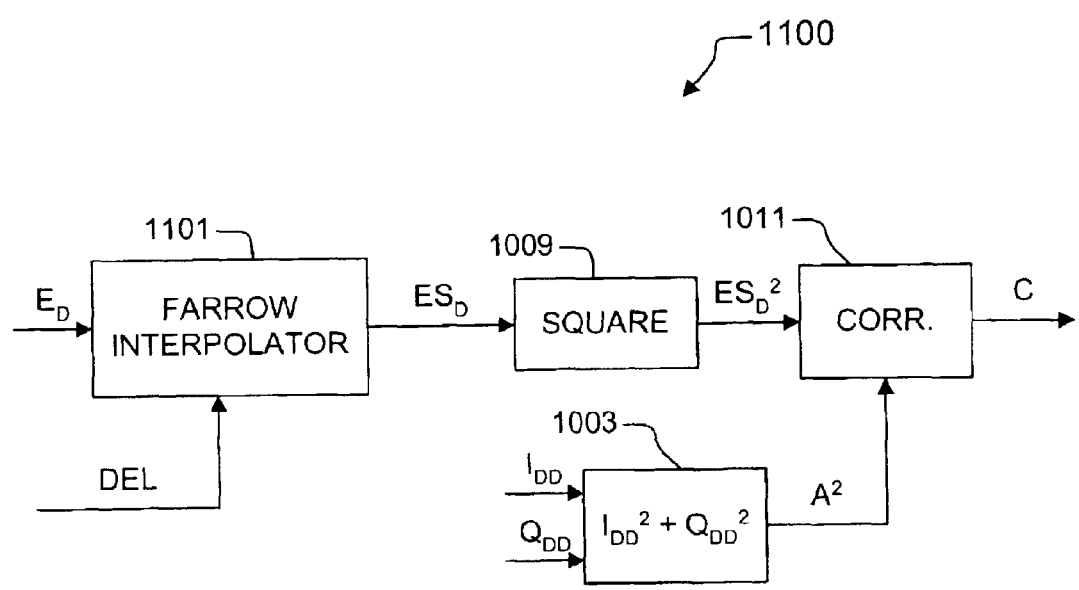
FIG. 11 is a block diagram of another exemplary correlation circuit that is used to achieve more accurate time alignment using a Farrow interpolator.

FIG. 11 is a block diagram of another exemplary correlation circuit 1100 that is used to achieve more accurate time alignment using a Farrow interpolator 1101. The correlation circuit 1100 is substantially similar to the correlation circuit 1000, except that the switch 1005 and the polyphase filters 1007 are replaced by the Farrow interpolator 1101. Similar components assume identical reference numbers. The Farrow interpolator 1101 receives a delay control signal DEL, which is varied to change the fractional sample delay amount through the Farrow interpolator 1101. Operation of the correlation circuit 1100 is similar to the correlation circuit 1000, in which the correlation results C output from the correlator 1011 are monitored while adjusting the DEL signal to determine optimal timing alignment. In this case, the DEL control signal is externally adjusted during test until optimal correlation results C are achieved, and the unit is programmed accordingly in a similar manner as previously described.

Figure 12:
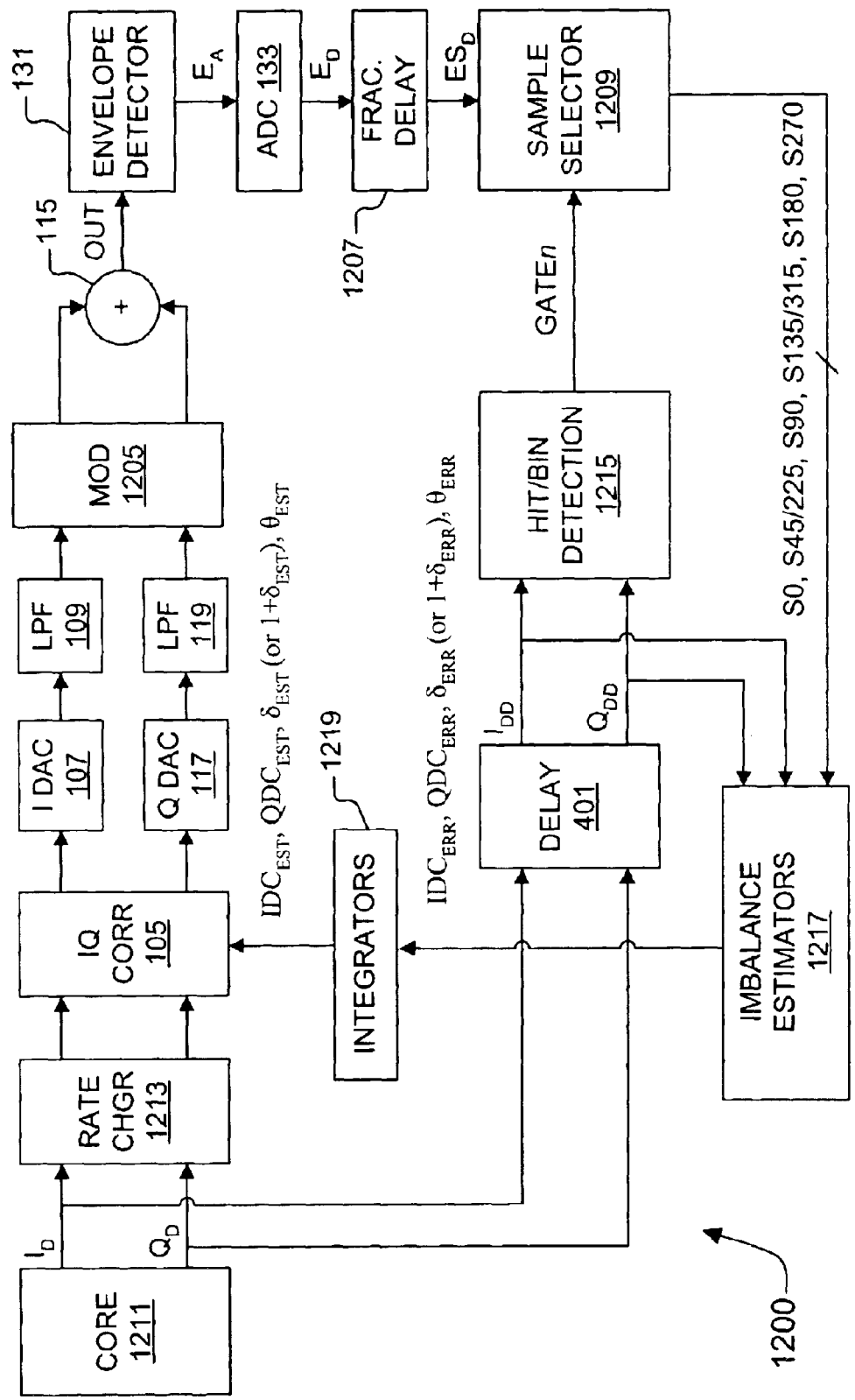
FIG. 12 is a block diagram of a transmitter including on-signal quadrature modulator calibration implemented according to an exemplary embodiment of the present invention illustrating closed loop operation.

FIG. 12 is a block diagram of a transmitter 1200 including on-signal quadrature modulator calibration implemented according to an exemplary embodiment of the present invention illustrating closed loop operation. The transmitter 1200 includes a digital portion performed within a baseband processor (e.g., the baseband processor 210) and an analog portion performed within an analog quadrature modulator (e.g., the quadrature modulator 203). The lines of demarcation between the digital and analog portions includes the I DAC 101 and the Q DAC 109 in the I and Q signal paths previously described, and the ADC 133 in the feedback path. The analog portion is substantially the same and includes the LPFs 109 and 119, an RF modulator 1205, the summing junction 115 and the envelope detector 131 for sensing the OUT signal. The RF modulator 1205 includes, for example, the local oscillator 125, the oscillator splitter 127 and the mixers 113 and 123.

The digital portion includes an optional fractional delay device 1207 which delays the $E_D$ samples and provides shifted $ES_D$ samples. As previously described, the fractional delay function may be performed by filtering or interpolation or the like. The shifted $ES_D$ samples are provided to a sample selector block 1209, which selects the delayed $ES_D$ samples based on a gating function defined by GATEn signals. The GATEn signals represents a combination of the hit and bin signals H1–H4 and B1–B4 previously described. The digital portion includes a kernel or core 1211, which provides the $I_D$ and $Q_D$ digital values to a rate changer filter 1213 and to the delay block 401. The core 1211 is implemented according to OFDM or CCK or the like. The rate changer filter 1213 is used to increase the rate of the digital values to a higher rate to facilitate improved operation of the DACs 107, 117. For example, the rate changer filter 1213 may up-sample 20 MHz signals (OFDM) or 22 MHz signals (CCK) to a selected higher rate, such as, for example, 44 MHz or 80 MHz as known to those having ordinary skill in the art. The I and Q outputs of the rate changer filter 1213 are provided to the IQ correction circuit 105 previously described.

The delayed $I_{DD}$ and $Q_{DD}$ digital values from the delay block 401 are provided to a HIT/BIN detection block 1215, which generates the GATEn signals. In this case, the detection block 1215 includes the combined functions of the detection blocks 403, 503, 603 and 803 in which it asserts the GATEn signals indicative of a hit within any of the operative selection boxes and identification of the corresponding selection box for which each hit occurred. It is noted that in one embodiment, the selection boxes M0 and M180 are configured with the same size, shape and location as the selection boxes 605a and 605b and that the selection boxes M90 and M270 are configured with the same size, shape and location as the selection boxes 607a and 607b, so that only the selection boxes 605a,b and 607a,b are used for detecting and correcting both DC and amplitude imbalances. It is also noted that the four selection boxes 605a,b and 607a,b represents six different bin values, including one bin value for each selection box for DC calibration, and one bin for the combined selection boxes 605a and 605b and another bin for the combined selection boxes 607a and 607b for amplitude calibration. The detection block 1215 also detects and reports the gating functions for the selection boxes 805a,b and 807a,b for detecting and calibrating phase imbalances.

The sample selector block 1209 outputs to imbalance estimators 1217 selected $ES_D$ samples several group sample group signals based on the GATE$_n$ signals, where the sample group signals include S0, S45/225, S90, S135/315, S180 and S270. The first sample group S0 includes each $ES_D$ sample that is a hit within the selection box 605b. The second sample group S45/225 includes each $ES_D$ sample that is a hit within either of the selection boxes 805a and 805b. A third sample group S90 includes each $ES_D$ sample that is a hit within the selection box 607a. The fourth sample group S135/315 includes each $ES_D$ sample that is a hit within either of the selection boxes 8075a and 807b. The fifth sample group S180 includes each $ES_D$ sample that is a hit within the selection box 605a. The sixth sample group S270 includes each $ES_D$ sample that is a hit within the selection box 607b.

In the embodiment shown, the imbalance estimators 1217 incorporate the functionality similar to the calculator blocks 413, 513 for determining $IDC_{ERR}$ and $QDC_{ERR}$ values, which are provided to integrators 1219. In the configuration shown, the average blocks 409, 411, 509, and 511 are not included in the imbalance estimators 1217. Instead, the $IDC_{ERR}$ value is calculated as half the difference between the sum of the samples of the sample groups S0 and S180. In a similar manner, the $QDC_{ERR}$ value is calculated as half the difference between the sum of the samples of the sample groups S90 and S270. The $IDC_{ERR}$ value is updated for each new sample from the sample groups S0 or S180, and the $QDC_{ERR}$ value is updated for each new sample from the sample groups S90 or S270.

The $I_{DD}$ and $Q_{DD}$ digital values from the delay block 401 are provided to the imbalance estimators 1217. In one embodiment, the imbalance estimators 1217 incorporate the functionality of blocks 609, 611 and 613 for calculating the $A^2$ values, for squaring each of the sample values of the sample groups S0 and S180, and dividing the squared samples by $A^2$ to generated normalized power values $P_I$. The imbalance estimators 1217 also calculate a normalized power value $P_Q$ in a similar manner, and the ratio of $P_Q/P_I$ is determined to derive $1+2\delta_{ERR}$ values in a similar manner as previously described. Alternatively, the magnitude values are calculated and the ratio of $M_Q/M_I$ is determined to derive $1+\delta_{ERR}$ values. In another alternative embodiment, the amplitude imbalance delta error terms $\delta_{ERR}$ are approximated as $P_Q-P_I \approx \delta_{ERR}$. The $1+\delta_{ERR}$ values or, alternatively, the $\delta_{ERR}$ values are provided to the integrators 1219. In a similar manner, the imbalance estimators 1217 calculate normalized power values $P_{45}$ using the digital samples from the sample group S45/135 and normalized power values $P_{135}$ using the samples from the sample group S135/315. The imbalance estimators 1217 approximate a phase imbalance theta error term $\theta_{ERR}$ as $(P_{135}-P_{45})/(P_{135}+P_{45}) \approx \sin(\theta_{ERR}) \approx \theta_{ERR}$. In an alternative embodiment, the phase imbalance theta term $\theta_{ERR}$ is approximated as $(P_{135}-P_{45}) \approx \theta_{ERR}$.

The $IDC_{ERR}$, $QDC_{ERR}$, $\delta_{ERR}$ (or $1+\delta_{ERR}$) and $\theta_{ERR}$ error values are further processed by the integrators 1219 to generate corresponding estimate values $IDC_{EST}$, $QDC_{EST}$, $\delta_{EST}$ and $\theta_{EST}$, respectively. The integrators 1219 apply filtering to convert the error values to the estimate values before being applied to the IQ correction circuit 105 to ensure proper loop operation. In the embodiment shown, for example, the $IDC_{EST}$ value is determined by the integrators 1219 and provided to the IQ correction circuit 105, where $IDC_{EST}(n+1)=IDC_{EST}(n)+K_I*IDC_{ERR}$, in which "n" is an index value that is incremented from one sample to the next, $IDC_{EST}(n+1)$ is the updated estimate value, $IDC_{EST}(n)$ is the previous estimate value, $K_I$ is a constant or programmable multiplier that is less than one that determines the bandwidth or speed of convergence of the $IDC_{EST}$ values, $IDC_{ERR}$ is the value provided from the imbalance estimators 1217, and the asterisk "*" denotes multiplication. A $QDC_{EST}$ value is determined by the integrators 1219 and provided to the IQ correction circuit 105 in a similar manner, where $QDC_{EST}(n+1)=QDC_{EST}(n)+K_Q*QDC_{ERR}$, in which $QDC_{EST}(n+1)$ is the updated estimate value, $QDC_{EST}(n)$ is the previous estimate value, $K_Q$ is a constant or programmable multiplier that is less than one that determines the bandwidth or speed of convergence of the $QDC_{EST}$ values, and $QDC_{ERR}$ is the value provided from the imbalance estimators 1217. An $\delta_{EST}$ value is determined by the integrators 1219 and provided to the IQ correction circuit 105, where $\delta_{EST}(n+1)=\delta_{EST}(n)+K_\delta*\delta_{ERR}$, in which $\delta_{EST}(n+1)$ is the updated estimate value, $\delta_{EST}(n)$ is the previous estimate value, $K_\delta$ is a constant or programmable multiplier that is less than one that determines the bandwidth or speed of convergence of the $\delta_{EST}$ values, and $\delta_{ERR}$ is the value provided from the imbalance estimator 1217. An $\theta_{EST}$ value is determined by the integrators 1219 and provided to the IQ correction circuit 105 in a similar manner, where $\theta_{EST}(n+1)=\theta_{EST}(n)+K_\theta*\theta_{ERR}$, in which $\theta_{EST}(n+1)$ is the updated estimate value, $\theta_{EST}(n)$ is the previous estimate value, $K_\theta$ is a constant or programmable multiplier that is less than one that determines the bandwidth or speed of convergence of the $\theta_{EST}$ values, and $\theta_{ERR}$ is the value provided from the imbalance estimators 1217.

The distortion estimate values $IDC_{EST}$, $QDC_{EST}$, $\delta_{EST}$, and $\theta_{EST}$ values are programmed with initial or default values. In one embodiment, the distortion estimate values are initially set to zero. Alternatively, the distortion estimate values are each set to corresponding default values at the time of manufacture that are predetermined to effectively establish initial static compensation. The feedback error loops measure estimated distortions and modify the distortion estimate values accordingly, which dynamically converge to more accurate values to reduce or otherwise eliminate DC offsets and amplitude and phase imbalances.

Figure 13:
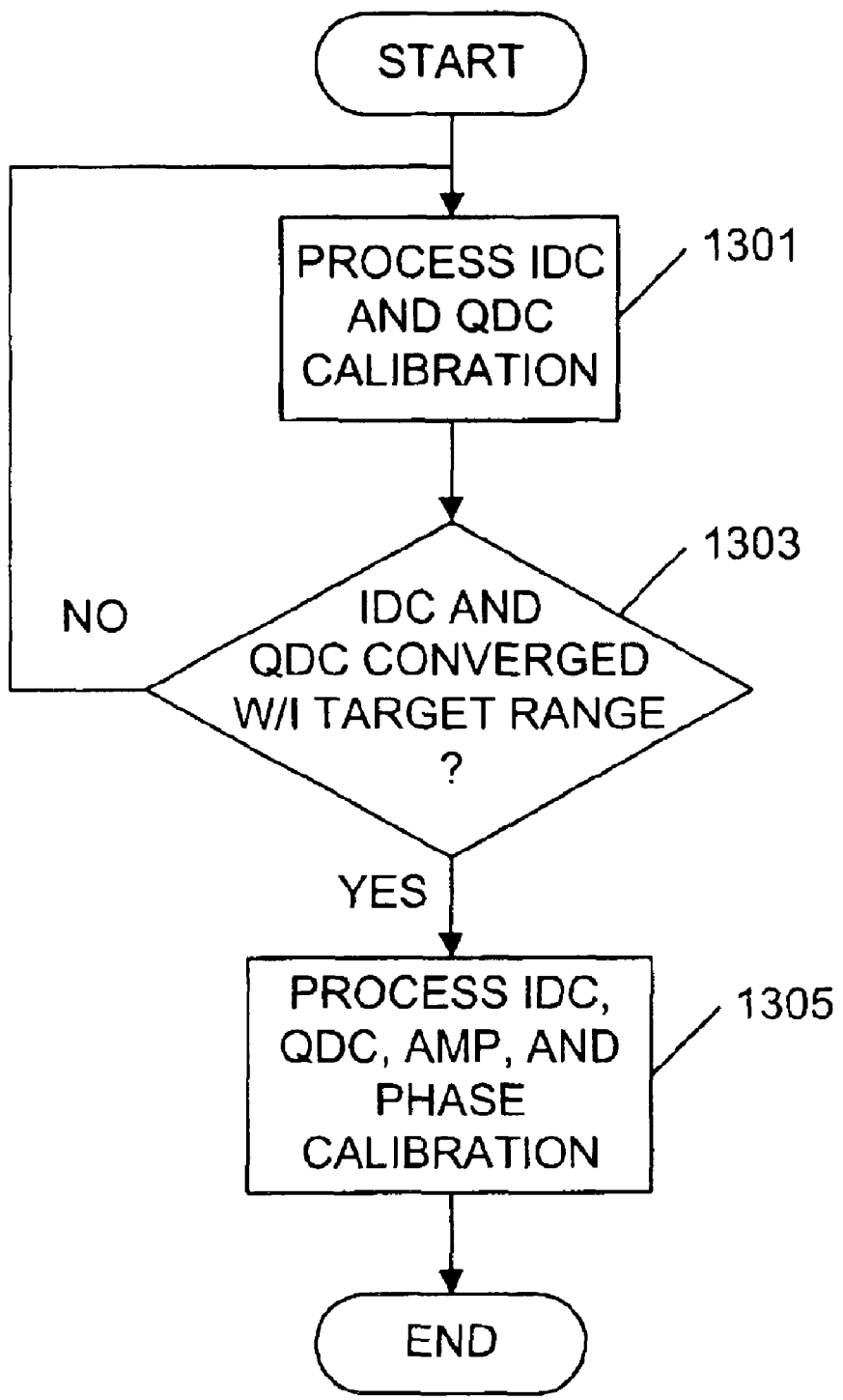
FIG. 13 is a simplified flowchart diagram illustrating the order of calibration processing according to an exemplary embodiment of the present invention.

FIG. 13 is a simplified flowchart diagram illustrating the order of calibration processing according to an exemplary embodiment of the present invention. The method illustrated may be employed by any or all of the embodiments described herein, including the transmitters 100, 300, and 1200. It is appreciated that the selection boxes used for DC calibration are similar to the selection boxes used for amplitude compensation. It is determined that the DC offsets may negatively impact determination of amplitude and phase compensation, so that it is desired to first adjust DC to within a predetermined target range before compensating for amplitude and phase.

At first block 1301, after power up and/or reset and during transmission, IDC and QDC calibration begins while amplitude and phase compensation is temporarily suspended. Operation continues for IDC and QDC calibration until the $IDC_{EST}$, $QDC_{EST}$ values converge to within a predetermined target range, as indicated at next query block 1303. Convergence means that the I and Q DC offsets are being resolved and reduced by compensation to eliminate the DC offsets in the OUT signal. The target range is determined arbitrarily or experimentally and selected so that the DC offsets are reduced to a small enough level to enable relatively accurate amplitude and phase calibration to begin. Upon convergence to within the target range, operation proceeds to block 1305 in which the compensation loop is operated for amplitude and phase distortions as well as the I and Q DC offsets. In this manner, the I and Q DC offsets are first removed to within an acceptable range and then all of the compensation loops are operated together for compensating DC, amplitude and phase distortions.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. An on-signal calibration system for a transmitter that generates in-phase (I) and quadrature phase (Q) values and that converts, modulates and combines the I and Q values into a radio frequency (RF) output signal for transmission, said calibration system comprising:

a detector that senses the RF output signal and that provides a detection signal indicative thereof;

a sampler that samples said detection signal and that provides digital samples;

a selector that selects from among said digital samples that correspond to predetermined ranges of the I and Q values;

an imbalance estimator that determines at least one imbalance estimate based on selected digital samples; and an IQ corrector that corrects said I and Q values using said at least one imbalance estimate.

2. The calibration system of claim 1, wherein said detector comprises an envelope detector.

3. The calibration system of claim 1, wherein said sampler comprises an analog to digital converter (ADC).

4. The calibration system of claim 1, further comprising:

said selector selecting digital samples that correspond with first and second selection boxes symmetrically located on either side of an I/Q origin on an I-axis of a plot of said I and Q values;

said selector selecting digital samples that correspond with third and fourth selection boxes symmetrically located on either side of said I/Q origin on a Q-axis;

wherein said imbalance estimator determines an I channel DC offset using selected digital samples of said first and second selection boxes and determined a Q channel DC offset using selected digital samples of said third and fourth selection boxes.

5. The calibration system of claim 1, further comprising:

said selector selecting digital samples that correspond with first and second selection boxes symmetrically located on either side of an I/Q origin on an I-axis of a plot of said I and Q values;

said selector selecting digital samples that correspond with third and fourth selection boxes symmetrically located on either side of said I/Q origin on a Q-axis; and wherein said imbalance estimator determines an amplitude imbalance estimate using selected digital samples.

6. The calibration system of claim 1, further comprising:

said selector selecting digital samples correspond with first and second selection boxes symmetrically located on either side of an I/Q origin on a 45 degree axis of a plot of said I and Q values;

said selector selecting digital samples that correspond with third and fourth selection boxes symmetrically located on either side of said I/Q origin on a 135 degree axis; and wherein said imbalance estimator determines a phase imbalance estimate using selected digital samples.

7. The calibration system of claim 1, further comprising:

a power circuit that determines digital power values using said digital samples and the I and Q values;

said selector selecting from among said digital power values; and said imbalance estimator determining said at least one imbalance estimate based on a ratio of selected digital power values.

8. The calibration system of claim 1, further comprising:

a magnitude circuit that determines digital magnitude values using said digital samples and the I and Q values;

said selector selecting from among said digital magnitude values; and said imbalance estimator determining said at least one imbalance estimate based on a ratio of selected magnitude values.

9. A transmitter, comprising:
a baseband processor providing I and Q signals, comprising:
an I/Q corrector that corrects said I and Q signals using at least one imbalance metric;
a hit detector that generates gate signals indicative of predetermined ranges of said I and Q signals;
a selector, coupled to said hit detector, that selects portions of a characteristic signal based on said gate signals; and
an imbalance estimator, coupled to said selector and said imbalance estimator, that uses selected portions of said characteristic signal to determine said at least one imbalance metric;
a radio frequency (RF) quadrature modulator that coverts said I and Q signals into an RF output signal; and
an output signal detector that senses a characteristic of said RF output signal indicative of said at least one imbalance and that outputs said characteristic signal.

10. The transmitter of claim 9, wherein said output signal detector comprises an envelope detector and wherein said characteristic signal comprises an envelope signal.

11. The transmitter of claim 9, wherein said baseband processor further comprises:
a core that generates I and Q digital values;
a sampler that samples said characteristic signal and that provides digital samples;
said hit detector providing said gate signals indicative of a plurality of symmetric selection boxes at predetermined phases of said I and Q digital values; and
said selector selecting from among said digital samples based on said gate signals.

12. The transmitter of claim 11, wherein:
said imbalance estimator determines an I DC offset based on digital samples corresponding with selection boxes at 0 and 180 degrees; and
wherein said imbalance estimator determines a Q DC offset based on digital samples corresponding to selection boxes at 90 and 270 degrees.

13. The transmitter of claim 11, wherein said imbalance estimator determines an amplitude imbalance based on digital samples corresponding to selection boxes at 0, 90, 180 and 270 degrees.

14. The transmitter of claim 11, wherein said imbalance estimator determines a phase imbalance based on digital samples corresponding to selection boxes at 45, −135, 135 and 315 degrees.

15. The transmitter of claim 11, wherein said baseband processor further comprises:
said imbalance estimator providing at least one imbalance error value using said selected digital samples; and
an integrator, coupled to said imbalance estimator and said I/Q corrector, that integrates each said at least one imbalance error value to provide said at least one imbalance metric.

16. The transmitter of claim 11, wherein said baseband processor further comprises:
a power circuit, coupled to said core and said sampler, that determines and provides digital power values based on said I and Q digital values and said digital samples;
said selector selecting from among said digital power values and sorting selected digital power values into first and second sets of digital power values; and
said imbalance estimator using said first and second sets of digital power values to determine said at least one imbalance metric.

17. The transmitter of claim 16, wherein said baseband processor further comprises a first average block that averages said first set of digital power values and a second average block that averages said second set of digital power values.

18. The transmitter of claim 16, wherein said baseband processor further comprises:
said selector providing said first set of digital power values as I power values corresponding to 0 and 180 degree selection boxes and said second set of digital power values as Q power values corresponding to 90 and 270 degree selection boxes; and
said imbalance estimator calculating a ratio of said Q and I power values for providing an amplitude imbalance metric.

19. The transmitter of claim 16, further comprising:
said selector providing said first set of digital power values as first phase power values corresponding to 45 and −135 degree selection boxes and said second set of digital power values as second phase power values corresponding to 135 and 315 degree selection boxes; and
said imbalance estimator calculating a differential of said first and second phase power values for providing a phase imbalance metric.

20. The transmitter of claim 11, wherein said baseband processor further comprises:
a magnitude circuit, coupled to said core and said sampler, that determines and provides digital magnitude values based on said I and Q digital values and said digital samples; and
said selector selecting from among said digital magnitude values and sorting selected digital magnitude values into first and second sets of digital magnitude values; and
said imbalance estimator using said first and second sets of digital magnitude values to determine said at least one imbalance metric.

21. The transmitter of claim 11, wherein said baseband processor further comprises a digital delay block that receives said I and Q digital values and that provides delayed I and Q digital values.

22. The transmitter of claim 21, wherein said baseband processor further comprises a fractional delay device that delays said digital samples to align timing with said delayed I and Q digital values.

23. A method of on-signal calibration of a radio frequency (RF) quadrature modulator which modulates in-phase (I) and quadrature phase (Q) signals incorporating I and Q digital values into an RF output signal, comprising:
detecting the RF output signal and providing a detection signal;
sampling the detection signal and providing digital samples;
selecting from among the digital samples corresponding to predetermined ranges of the I and Q digital values;
estimating at least one imbalance metric using selected digital samples; and
calibrating the I and Q signals using the at least one imbalance metric.

24. The method of claim 23, wherein said detecting the RF output signal and providing a detection signal comprises detecting an envelope of the RF output signal and providing an envelope signal.

25. The method of claim 23, wherein:
said selecting comprising selecting digital samples corresponding to first, second, third and fourth symmetrical selection boxes at 0, 90, 180 and 270 degree phase, respectively; and wherein said estimating comprising estimating an I channel DC offset using the digital samples of the first and third symmetrical selection boxes, and estimating a Q channel DC offset using the digital samples of the second and fourth symmetrical selection boxes.

26. The method of claim 23, wherein:
said selecting comprising selecting digital samples corresponding to first, second, third and fourth symmetrical selection boxes at 0, 90, 180 and 270 degree phase, respectively; and wherein said estimating comprising estimating an amplitude imbalance using the selected digital samples.

27. The method of claim 23, wherein:
said selecting comprising selecting digital samples corresponding to first, second, third and fourth symmetrical selection boxes at 45, 135, 225 and 315 degree phase, respectively; and wherein said estimating comprising estimating a phase imbalance using the selected digital samples.

28. The method of claim 23, wherein:
said selecting comprising selecting digital samples corresponding to first, second, third, fourth, fifth, sixth, seventh and eighth symmetrical selection boxes at 0, 45, 90, 135, 180, 225, 270 and 315 degree phase, respectively; and wherein said estimating comprising determining an I channel DC offset error using selected digital samples of the first and fifth selection boxes, determining a Q channel DC offset error using selected digital samples of the third and seventh selection boxes, determining an amplitude imbalance error using selected digital samples of the first, third, fifth and seventh selection boxes, and determining a phase imbalance error using selected digital samples of the second, fourth, sixth and eighth selection boxes.

29. The method of claim 28, further comprising integrating the I channel DC offset error, the Q channel DC offset error, the amplitude imbalance error and the phase imbalance error over time using corresponding loop multipliers.

30. The method of claim 23, further comprising:
determining power values using the digital samples and the I and Q digital values;

said selecting comprising selecting power values corresponding to symmetrical selection boxes at 0, 90, 180 and 270 phase; and said estimating comprising estimating an amplitude imbalance using the selected power values.

31. The method of claim 23, further comprising:
determining power values using the digital samples and the I and Q digital values;

said selecting comprising selecting power values corresponding to symmetrical selection boxes at 45, 135, 225 and 315 phase; and said estimating comprising estimating a phase imbalance using the selected power values.

32. The method of claim 23, further comprising:
determining magnitude values using the digital samples and the I and Q digital values.

said selecting comprising selecting magnitude values corresponding to symmetrical selection boxes at 0, 90, 180 and 270 phase; and said estimating comprising estimating an amplitude imbalance using the selected magnitude values.

* * * * *